US005532088A

United States Patent [19]

Teshima et al.

[11] Patent Number: 5,532,088

[45] Date of Patent: Jul. 2, 1996

[54] SHADOW MASK PLATE MATERIAL AND SHADOW MASK

[75] Inventors: Koichi Teshima; Yoshinori Fujimori, both of Tokyo; Shin-ichi Nakamura, Yokohama; Masayuki Fukuda, Yokohama; Michihiko Inaba, Yokohama; Emiko Higashinakagawa, Kawasaki; Yasuhisa Ohtake, Fukaya; Eiichi Akiyoshi, Hyogo-ken, all of Japan

[73] Assignee: Kabushiki Kaisha Toshiba, Kawasaki, Japan

[21] Appl. No.: 193,867

[22] Filed: Feb. 9, 1994

[30] Foreign Application Priority Data

Mar. 12, 1993 [JP] Japan .................................... 5-079116

[51] Int. Cl.$^6$ ........................................................ G03F 9/00

[52] U.S. Cl. .................................. 430/4; 430/23; 430/36; 430/323

[58] Field of Search ................................ 430/23, 323, 36, 430/4

[56] References Cited

U.S. PATENT DOCUMENTS 5,308,723 5/1994 Inoue et al. ................................ 430/23

FOREIGN PATENT DOCUMENTS 59-32859 8/1984 Japan .
2-101116 4/1990 Japan .
4-341543 11/1992 Japan .

*Primary Examiner*—S. Rosasco
*Attorney, Agent, or Firm*—Oblon, Spivak, McClelland, Maier & Neustadt

[57] ABSTRACT

Disclosed is a shadow mask plate material which consists of an Fe-Ni-based alloy containing iron and nickel as main constituents, has an unrecrystallized texture with a grain size of 10 μm or less, and is excellent in etching characteristics for forming electron beam apertures.

14 Claims, 7 Drawing Sheets

SHADOW MASK PLATE MATERIAL AND SHADOW MASK

BACKGROUND OF THE INVENTION

1. Field of the Invention

The present invention relates to a shadow mask plate material and a shadow mask for use in a color-CRT.

2. Description of the Related Art

A shadow mask with a plurality of electron beam apertures is assembled into a color-CRT. The shadow mask has a function of projecting accurate electron beam spots onto a tricolor phosphor screen. For this reason, the relative positions, the aperture sizes, and the aperture shapes of the electron beam apertures have a direct influence on image quality, and so a high processing accuracy is required in formation of the electron beam apertures. In addition, to prevent occurrence of scattering electrons, it is also necessary to perform special processing for chamfering the edge of the electron beam aperture opposing the phosphor screen into a semispheric shape. If these processing accuracies are low, a decrease in image quality results due to doming. The electron beam apertures of a shadow mask as described above are formed by processing a shadow mask plate material by use of photoetching.

Recently, a general demand has increasingly arisen for a "high definition" of a TV screen, and the development of a high-definition TV system also has advanced in communication systems. Therefore, it is necessary to form finer electron beam apertures in a shadow mask for a color-CRT in order to improve its resolution.

To meet the above requirements, the use of a plate of an invar alloy such as a 3 wt % Ni-Fe alloy has been attempted. The invar alloy has a small thermal expansion coefficient. Therefore, a positional difference of electron beam apertures can be prevented in a shadow mask made from an invar alloy plate even if the temperature is raised due to bombardment of electron beams. Consequently, a color misregistration can be prevented. As an example, Jpn. Pat. Appln. KOKAI Publication No. 59-149638 discloses a shadow mask which has a recrystallized texture manufactured through steps of melting, hot forging, hot rolling, cold rolling intermediate annealing, adjustment rolling, and annealing for forming a recrystallized texture of an invar alloy as a raw material, and in which crystal faces on the surface are aligned in a {100} faces.

With increasing size and definition of a color-CRT, a shadow mask is also required to have more accurate, finer electron beam apertures. That is, in addition to having a small thermal expansion coefficient, a shadow mask plate material is required to allow easy and highly accurate formation of electron beam apertures which are fine and uniform in shape. However, when electron beam apertures are formed in the invar alloy-based plate material by photoetching, defective aperture shapes and white unevenness are found. This consequently make it difficult to improve image quality. More specifically, when desired electron beam apertures were formed by photoetching in the plate material disclosed in Jpn. Pat. Appln. KOKAI Publication No. 59-149638, in which the surface crystal faces were aligned in a {100} face, the electron beam apertures formed had an ideal similar figure. When observed microscopically, however, the sizes of these apertures varied from each other, and white unevenness caused by the difference in etched surface roughness was found.

Jpn. Pat. Appln. KOKAI Publication No. 4-341543, on the other hand, discloses an Fe-Ni-based shadow mask material which is manufactured by performing hot rolling, annealing, and cold rolling for an alloy containing 34 to 38 wt % of Ni and the balance consisting primarily of Fe, and in which the degree of aggregation of {111} crystal faces on the surface is 20% or more. This shadow mask material has a recrystallized texture and a high blackening processability resulting from the above definition of the degree of aggregation.

SUMMARY OF THE INVENTION

It is an object of the present invention to provide a shadow mask plate material having excellent etching properties for forming electron beam apertures and a low thermal expansion coefficient.

It is another object of the present invention to provide a shadow mask plate material which has a high strength, causes little deflection, and has remarkable etching properties for forming electron beam apertures.

It is still another object of the present invention to provide a shadow mask suitable for a color-CRT, which has highly accurate, fine electron beam apertures and can prevent a positional difference of the electron beam apertures caused by a temperature rise upon bombardment of electron beams.

It is still another object of the present invention to provide a shadow mask suitable for a large-size, high-quality color-CRT, which has highly accurate, fine electron beam apertures, can prevent a positional difference of the electron beam apertures caused by a temperature rise upon bombardment of electron beams, and also can prevent occurrence of depression and deflection resulting from thin film formation and flattening.

According to one aspect of the present invention, there is provided a shadow mask plate material consisting of an Fe-Ni-based alloy which contains iron and nickel as main constituents, and having an unrecrystallized texture with a grain size of 10 μm or less.

According to another aspect of the present invention, there is provided a shadow mask plate material consisting of an Fe-Ni-based alloy which contains iron and nickel as main constituents and 0.01 wt % or less of boron, and having an unrecrystallized texture with a grain size of 10 μm or less.

According to still another aspect of the present invention, there is provided a shadow mask comprising a plate material consisting of an Fe-Ni-based alloy, a plurality of fine electron beam apertures formed in the plate material, and a black film formed on the surface of the plate material, and manufactured by a method comprising the steps of:

forming a plurality of fine electron beam apertures in a plate material consisting of an Fe-Ni-based alloy which contains iron and nickel as main constituents, and having an unrecrystallized texture with a grain size of 10 μm or less;

press-molding the plate material; and forming a black film on the surface of the plate material.

According to still another aspect of the present invention, there is provided a shadow mask comprising a plate material consisting of an Fe-Ni-based alloy, a plurality of fine electron beam apertures formed in the plate material, and a black film formed on the surface of the plate material, and manufactured by a method comprising the steps of:

forming a plurality of fine electron beam apertures in a plate material consisting of an Fe-Ni-based alloy which contains iron and nickel as main constituents and 0.01 wt % or less of boron, and having an unrecrystallized texture with a grain size of 10 μm or less; press-molding the plate material; and forming a black film on the surface of the plate material.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Figure 1:
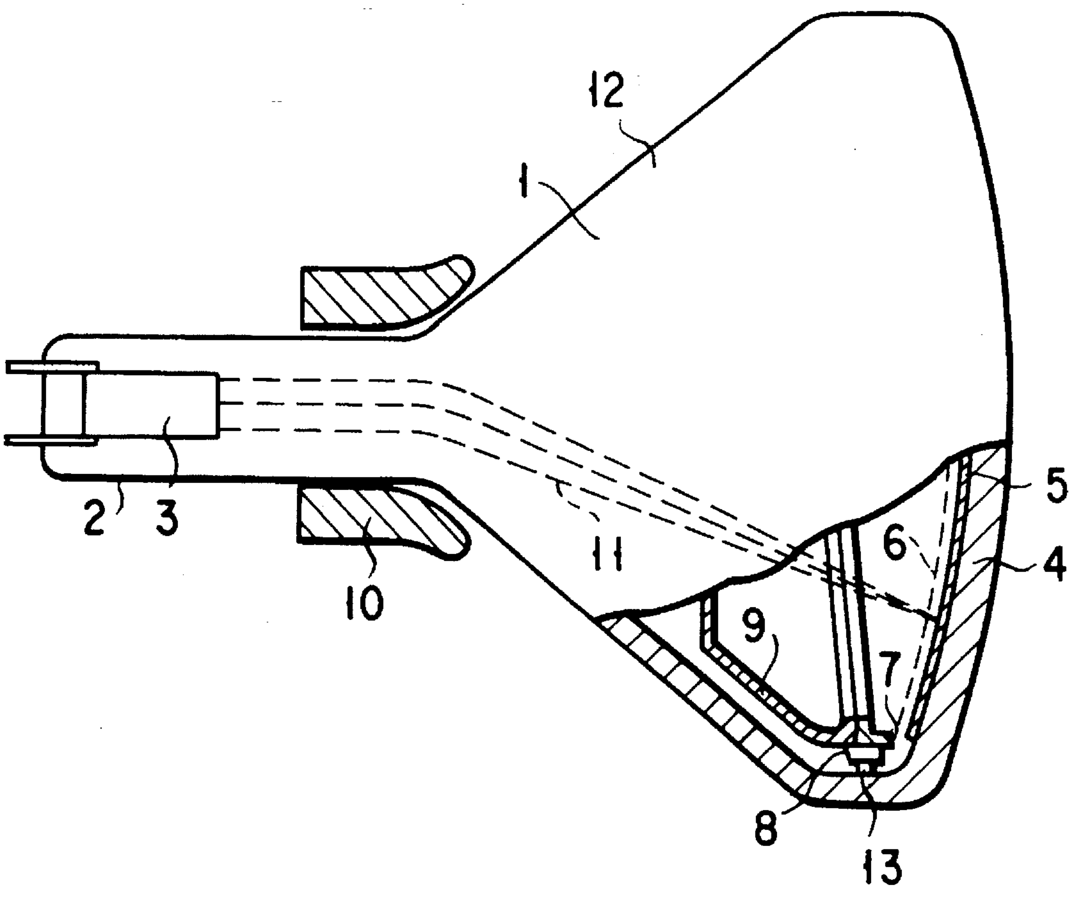
FIG. 1 is a sectional view showing a color-CRT which may incorporate the present invention.

A shadow mask plate material according to the present invention consists of an Fe-Ni-based alloy containing iron and nickel as main constituents, and has an unrecrystallized texture with a grain size of 10 μm or less.

The above Fe-Ni-based alloy preferably has a composition containing 20 to 48 wt % of nickel and the balance essentially consisting of iron. If the nickel amount falls outside this range, the thermal expansion coefficient of the shadow mask plate material can no longer be $7\times10^{-6}$/°C. or less. Therefore, a positional difference of electron beam apertures increases due to a temperature rise upon bombardment of electrons, and this eventually makes it difficult to obtain a shadow mask with a necessary function. The nickel amount more preferably ranges between 30 and 40 wt %.

In this Fe-Ni-based alloy, a portion of nickel may be substituted with at least one metal selected from cobalt and chromium. The substitution amounts of cobalt and chromium are preferably 0.01 to 10 wt % and 0.01 to 5 wt %, respectively. If, however, nickel is to be substituted with both of cobalt and chromium, it is desirable that the cobalt amount be larger than the chromium amount.

The Fe-Ni-based alloy may contain 0.01 wt % or less of boron. A plate material composed of such an Fe-Ni-based alloy containing boron is improved in strength and deflection resistance. In addition, an unrecrystallized texture is stabilized in the plate material containing boron. The boron content in the Fe-Ni-based alloy is defined for the reasons explained below. That is, if the boron content is greater than 0.01 wt %, hot working properties, formability of a black film, etching properties and press molding properties may be degraded. The lower limit of the boron content is preferably 0.0001 wt %.The boron content is more preferably 0.001 to 0.008 wt %.

The Fe-Ni-based alloy may contain unavoidable impurity elements, e.g., 0.02% or less of C, 0.02% or less of Al, 0.01% or less of S, 0.1% or less of P, 0.02% or less of Mo, 50 ppm or less of nitrogen, 100 ppm or less of oxygen, 0.5% or less of Mn as a deoxidizing agent, and 0.1% or less of Si, all in weight ratio.

It is known that a crystal orientation on the plate surface of an Fe-Ni-based alloy, e.g., an invar alloy with f.c.c. crystal is oriented in a {110} face upon cold working or the like, and, during recrystallization performed by annealing, the crystallographic axes rotate to orient the plate surface in a {100} face. The above-mention "unrecrystallized texture", which the shadow mask plate material, means a texture before rotation of the crystallographic axes ends to complete a recrystallized texture in the recrystallization process. More specifically, it means the structure which the plate material has while being recrystallized with the crystallographic axes not aligned or directed. Note that the unrecrystallized texture may contain few recrystallized grains having a grain size of 10 μm or less.

The grain size of the shadow mask plate material according to the present invention has an influence not only on the index defining the unrecrystallized texture but also on the state of the etched surface. If the grain size exceeds 10 μm, the etched surface is not smoothened but roughened in formation of electron beam apertures by photoetching. The grain size is more preferably 5 μm or less.

In the shadow mask plate material according to the present invention, the X-ray diffraction peak ratios of at least crystal faces {111}, {200}, {220}, and {311} on the surface are preferably 20 or more, and more preferably 25 or more assuming that the highest X-ray diffraction peak of these crystal faces is 100. In particular, assuming that the highest X-ray diffraction peak of at least the crystal faces {111}, {200}, {220}, and {311} on the surface is 100, it is more preferable that the X-ray diffraction peak ratios of at least two crystal faces be 70 or more.

The shadow mask plate material according to the present invention desirably has a hardness (Hv) of 230 or less (or an Erichsen value of 7 or more), and more preferably 210 or less. Such a shadow mask plate material is improved in press molding properties.

The shadow mask plate material according to the present invention is manufactured by, e.g., the following method.

First, an alloy ingot having a composition containing nickel, unavoidable impurity elements, and Fe as the balance or a composition further containing a predetermined amount of boron in addition to these constituents is formed and subjected to hot working. The resultant material is then forged and hot-rolled at a temperature of 900° C. or more (preferably 1,000° to 1,200° C.). Subsequently, the resultant material is formed into a plate with a predetermined thickness by cold rolling. Finally, the resultant plate material is subjected to softening annealing at a temperature controlled to be lower than the recrystallization temperature, thereby manufacturing a shadow mask plate material.

The above shadow mask plate material according to the present invention consists of an Fe-Ni-based alloy containing iron and nickel as main constituents and has an unrecrystallized texture with a grain size of 10 μm or less, i.e., a texture in which very fine crystal grains aggregate together. For this reason, the plate material is improved in etching properties for forming electron beam apertures. That is, since etching proceeds evenly in a desired direction on the plate material from a microscopic viewpoint, it is possible to form electron beam apertures perpendicular to the etched surface and uniform in position and shape. Therefore, highly accurate, fine electron beam apertures can be formed in the plate material.

In addition, in the shadow mask plate material which has the unrecrystallized texture, and in which the X-ray diffraction peak ratios of at least crystal faces {111}, {200}, {220}, and {311} on the surface are preferably 20 or more assuming that the highest X-ray diffraction peak of these crystal faces is 100, fine crystal grains are aggregated, and etching anisotropy based on a difference in crystal face is significantly reduced. By performing photoetching for this plate material, therefore, extremely accurate, fine electron beam apertures can be formed with a high reproducibility.

Furthermore, since the shadow mask plate material consists of an Ni-Fe-based alloy with a low thermal expansion coefficient, a positional difference of electron beam apertures can be suppressed in a shadow mask manufactured from the plate material even if the temperature rises due to bombardment of electron beams.

Also, the shadow mask plate material which consists of an Ni-Fe-based alloy containing a predetermined amount of boron and has an unrecrystallized texture with a grain size of 10 μm or less has a high strength as well as good etching properties. This makes it possible to prevent occurrence of defects caused by depression and deflection after formation of a black film.

That is, the strength of a plate material consisting of an Ni-Fe-based alloy decreases if the plate material is formed into a thin film for the purpose of reducing its manufacturing cost. Therefore, if a black film is formed after electron beam apertures are formed in this plate material, depression and deflection take place on the surface of the obtained shadow mask, resulting in a defective product.

The above-mentioned plate material consisting of an Ni-Fe-based alloy containing a predetermined amount of boron and having an unrecrystallized texture is significantly improved in strength after thin film formation and formation of a black film. At result, depression and deflection are suppressed on the mask surface of a shadow mask manufactured from this plate material, and this prevents occurrence of defects caused by the depression or the like. The reason for this is estimated that the strength can be improved significantly because the plate material consisting of an Ni-Fe-based alloy containing a predetermined amount of boron has an unrecrystallized texture, and this unrecrystallized texture is stabilized by the addition of boron.

It is, however, difficult to suppress depression and deflection in a plate material which consists of an Ni-Fe-based alloy containing a predetermined amount of boron and has a recrystallized texture, and in a plate material which consists of an Ni-Fe-based alloy not added with boron and has an unrecrystallized texture.

A color-CRT into which the shadow mask according to the present invention is incorporated will be described below with reference to FIG. 1.

A color-CRT, as shown in FIG. 1, comprises a glass envelop 1, in-line electron guns 3 emitting three electron beams 11, and a phosphor screen 5 containing red, green, and blue phosphors which emit visible light when excited by the electron beams 11. Electron guns 3 are located in the neck portion 2 of the envelop 1, 10 while the phosphors, arranged in vertical stripes of cyclically repeating colors, are coated on the inner surface of the panel 4 of the envelope 1. Connecting neck 2 with panel 4 is the funnel portion 12 of the envelope 1. Electron beams 11 are deflected by magnetic fields produced by deflection yoke 10 surrounding a portion of the neck 2.

Near screen 5 is a shadow mask 6 having a plurality of vertically oriented rectangular apertures (not shown). Shadow mask 6 is attached to a mask frame 7 supported within the envelope by frame holders 8 which are releasably mounted on a plurality of panel pins 13 embedded in side walls of panel 4. An inner shield 9, also attached to the mask frame 7, extends part of the way along funnel 12 toward electron guns 3, shielding the electron beams 11 from the effects of terrestrial magnetism. After emission from electron guns 3, electron beams 11 are accelerated, deflected by deflection yoke 10, and converged. They then pass through the apertures of shadow mask 6 to bombard phosphor screen 5, reproducing a color image.

The above shadow mask comprises a plate material consisting of an Fe-Ni-based alloy, a plurality of fine electron beam apertures formed in the plate material, and a black film formed on the surface of the plate material, and is manufactured by a method comprising the steps of:

forming a plurality of fine electron beam apertures in a plate material consisting of an Fe-Ni-based alloy which contains iron and nickel as main constituents, and having an unrecrystallized texture with a grain size of 10 μm or less;

press-molding the plate material; and forming a black film on the surface of the plate material.

The above Fe-Ni-based alloy preferably has a composition containing 20 to 48 wt % of nickel and the balance essentially consisting of iron. If the nickel amount falls outside this range, the thermal expansion coefficient of the shadow mask plate material can no longer be $7 \times 10^{-6}$/°C. or less. Therefore, a positional difference of electron beam apertures increases due to a temperature rise upon bombardment of electrons, and this eventually makes it difficult to obtain a shadow mask with a necessary function. The nickel amount more preferably ranges between 30 and 40 wt %.

In this Fe-Ni-based alloy, a portion of nickel may be substituted with at least one metal selected from cobalt and chromium. The substitution amounts of cobalt and chromium are preferably 0.01 to 10 wt % and 0.01 to 5 wt %, respectively. If, however, nickel is to be substituted with both of cobalt and chromium, it is desirable that the cobalt amount be larger than the chromium amount.

The Fe-Ni-based alloy may contain 0.01 wt % or less of boron. A plate material composed of such an Fe-Ni-based alloy containing boron is improved in strength and deflection resistance. In addition, an unrecrystallized texture is stabilized in the plate material containing boron. The boron content in the Fe-Ni-based alloy is defined for the same reasons as explained for the plate material mentioned earlier. The lower limit of the boron content is preferably 0.0001 wt %. The boron content is more preferably 0.001 to 0.008 wt %.

The Fe-Ni-based alloy may contain unavoidable impurity elements, e.g., 0.02% or less of C, 0.02% or less of Al, 0.01% or less of S, 0.1% or less of P, 0.02% or less of Mo, 50 ppm or less of nitrogen, 100 ppm or less of oxygen, 0.5% or less of Mn as a deoxidizing agent, and 0.1% or less of Si, all in weight ratio.

The grain size of the plate material has an influence not only on the index defining the unrecrystallized texture but also on the state of the etched surface. If the grain size exceeds 10 μm, the etched surface is not smoothened but roughened in formation of electron beam apertures by photoetching. The grain size is more preferably 5 μm or less.

In the above plate material, the X-ray diffraction peak ratios of at least crystal faces {111}, {200}, {220}, and {311} on the surface are preferably 20 or more, and more preferably 25 or more assuming that the highest X-ray diffraction peak of these crystal faces is 100. In particular, assuming that the highest X-ray diffraction peak of at least the crystal faces {111}, {200}, {220}, and {311} on the surface is 100, it is more preferable that the X-ray diffraction peak ratios of at least two crystal faces be 70 or more.

The plate material preferably has a thickness of 0.1 to 0.3 mm. Especially when the plate material contains boron, it is possible to decrease the thickness to 0.1 to 0.18 mm.

The above plate material desirably has a hardness (Hv) of 230 or less (or an Erichsen value of 7 or more), and more preferably 210 or less. Such a plate material is improved in press molding properties.

The shadow mask as described above according to the present invention is manufactured by a step of performing photoetching for a plate material which consists of an Fe-Ni-based alloy containing iron and nickel as main constituents and has an unrecrystallized texture with a grain size of 10 μm or less, thereby forming a plurality of fine electron beam apertures, a step of press-molding the plate material, and a step of forming a black film on the surface of the plate material. Since the plate material having an unrecrystallized texture with a predetermined grain size has a texture in which very fine crystal grains aggregate together, highly accurate, fine electron beam apertures can be formed by the photoetching. Especially in the plate material which has the unrecrystallized texture, and in which the X-ray diffraction peak ratios of at least crystal faces {111}, {200}, {220}, and {311} on the surface are preferably 20 or more assuming that the highest X-ray diffraction peak of these crystal faces is 100, fine crystal grains are aggregated, and the etching anisotropy based on a difference in crystal face is significantly reduced. By performing photoetching for this plate material, therefore, it is possible to obtain a shadow mask in which extremely accurate, fine electron beam apertures are formed with a high reproducibility.

In addition, since the plate material has a low thermal expansion coefficient, a positional difference of electron beam apertures can be suppressed in a shadow mask manufactured from the plate material even if the temperature rises due to bombardment of electron beams. This consequently makes it possible to prevent a color misregistration.

Furthermore, the formation of the black film after the press molding improves the heat dissipation properties of the surface. As a result, it is possible to obtain a shadow mask in which doming resulting from a temperature rise on the surface is prevented.

Also, the shadow mask manufactured from the plate material, which consists of an Ni-Fe-based alloy containing a predetermined amount of boron and has an unrecrystallized texture with a grain size of 10 μm or less, through formation of the electron beam apertures and press molding has a high strength as well as good etching properties. This makes it possible to prevent occurrence of defects caused by depression and deflection after formation of a black film.

Preferred examples of the present invention will be described in detail below.

EXAMPLE 1

An invar alloy consisting of 36.2 wt % of Ni, 0.1 wt % or less of unavoidable impurities, such as P, Si, and Mn, and Fe as the balance was melted to form an ingot 600 mm wide, 10 m long, and 150 mm thick and weighing five tons. The ingot was then heated at 1,150° C. for four hours and formed into a 4 mm thick plate material by hot working. Subsequently, this plate material was annealed at 1,100° C. for four hours and cold-rolled into a 0.7 mm thick plate material. The resultant plate material was subjected to intermediate annealing at 800° C. and cold-rolled into a 0.3 mm thick plate material. Subsequently, the plate material was annealed at 850° C. for one minute and cold-rolled into a 0.2 mm thick plate material. Thereafter, the plate material was subjected to softening annealing in an oven set at 800° C., which was below the recrystallization temperature, for a detention time of 10 seconds, and was flattened by skin pass, thereby manufacturing a shadow mask plate material. Note that the maximum temperature of the plate material in the softening annealing step is estimated to be approximately 700° C. although it could not be actually measured.

Figure 2:
FIG. 2 is an optical micrograph showing the crystal texture of a shadow mask plate material obtained in Example 1 of the present invention.
Figure 3:
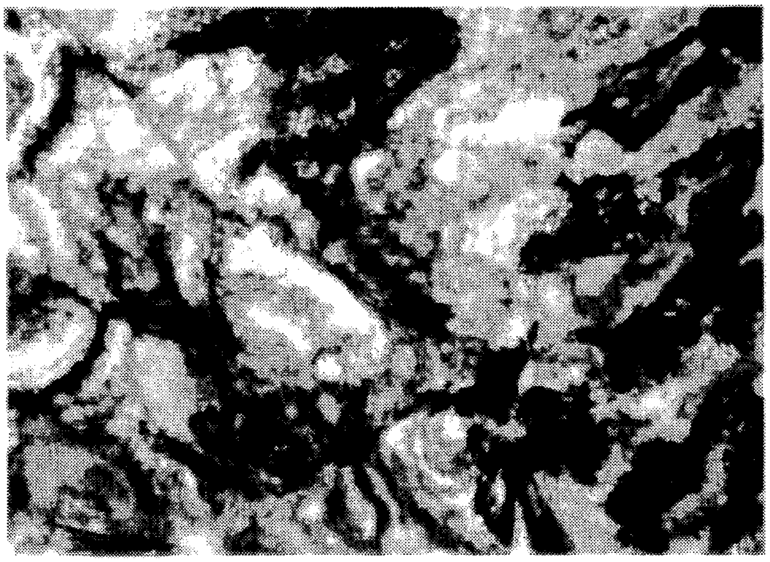
FIG. 3 is an electron micrograph showing the crystal texture of the shadow mask plate material obtained in Example 1 of the present invention.

FIG. 2 shows an optical micrograph (×500) of the shadow mask plate material of Example 1, and FIG. 3 shows an electron micrograph of the plate material. It was confirmed from FIGS. 2 and 3 that the shadow mask plate material of Example 1 had an unrecrystallized texture consisting of fine crystal grains of 10 μm or less.

Comparative Example 1

An invar alloy consisting of 36.2 wt % of Ni, 0.1 wt % or less of unavoidable impurities, such as P, Si, and Mn, and Fe as the balance was melted to form an ingot 600 mm wide, 10 m long, and 150 mm thick and weighing five tons. The ingot was then heated at 1,150° C. for four hours and formed into a 4 mm thick plate material by hot working. Subsequently, this plate material was annealed at 1,100° C. for four hours and cold-rolled into a 0.7 mm thick plate material. The resultant plate material was subjected to intermediate annealing at 1,000° C. and cold-rolled into a 0.2 mm thick plate material. Subsequently, the plate material was annealed at 900° C. for one minute and flattened by skin pass, thereby manufacturing a shadow mask plate material.

Figure 4:
FIG. 4 is an optical micrograph showing the crystal texture of a shadow mask plate material obtained in Comparative Example 1.
Figure 5:
FIG. 5 is an electron micrograph showing the crystal texture of the shadow mask plate material obtained in Comparative Example 1.

FIG. 4 shows an optical micrograph (×500) of the shadow mask plate material of Comparative Example 1, and FIG. 5 shows an electron micrograph of the plate material. It was confirmed from FIGS. 4 and 5 that the shadow mask plate material of Comparative Example 1 had a complete recrystallized texture consisting of large crystal grains.

The manufacturing steps of the shadow mask plate materials according to Example 1 and Comparative Example 1 are given in Table 1 below in order to indicate the difference between them.

TABLE 1

| | Example 1 | Comparative Example 1 |
|---|---|---|
| Hot rolling conditions | 1150° C., 4 hours | 1250° C., 4 hours |
| Plate thickness after hot rooling | 4 mm | 4 mm |
| Annealing condition | 1100° C., 4 hours | 1100° C., 4 hours |
| Plate thickness after cold rolling | 0.7 mm | 0.7 mm |
| Intermediate annealing temperature | 800° C. | 1000° C. |
| Plate thickness after cold rolling | 0.30 mm | 0.20 mm |
| Annealing conditions | 850° C., 1 minute | 900° C., 1 minute |
| Plate thickness after cold rolling | 0.20 mm | Only skin pass |
| Low-temperature annealing | 800° C., 10 seconds | — |

Rectangular electron beam apertures with a design size of 1.7×0.7 mm were formed by a conventional photoetching process in each of the shadow mask plate materials of Example 1 and Comparative Example 1. As a result, in the plate material of Example 1, electron beam apertures uniform in both size and shape were formed across the entire surface and no roughness was found on the etched surface. In contrast, in the plate material of Comparative Example 1, the etching accuracy was lower than that of the plate material of Example 1, and roughness on the etched surface also was found.

A high-quality shadow mask free from white unevenness could be obtained by press-molding the plate material of Example 1 with the electron beam apertures formed, and forming a black film on it.

EXAMPLE 2

An invar alloy consisting of 36 wt % of Ni, 0.1 wt % or less of unavoidable impurities, such as P, Si, and Mn, and Fe as the balance was melted to form an ingot 600 mm wide, 10 m long, and 150 mm thick and weighing five tons. The ingot was then heated at 1,200° C. for four hours and formed into a 3 mm thick plate material by hot working. Subsequently, this plate material was annealed at 1,100° C. for four hours and cold-rolled into a 0.7 mm thick plate material. The resultant plate material was subjected to intermediate annealing at 900° C. and cold-rolled into a 0.25 mm thick plate material. Subsequently, the plate material was continuously annealed at 620° C. and flattened by skin pass, thereby manufacturing a shadow mask plate material. Note that in the manufacture of this plate material, the working rate in the cold rolling step was 50% or more.

Figure 6:
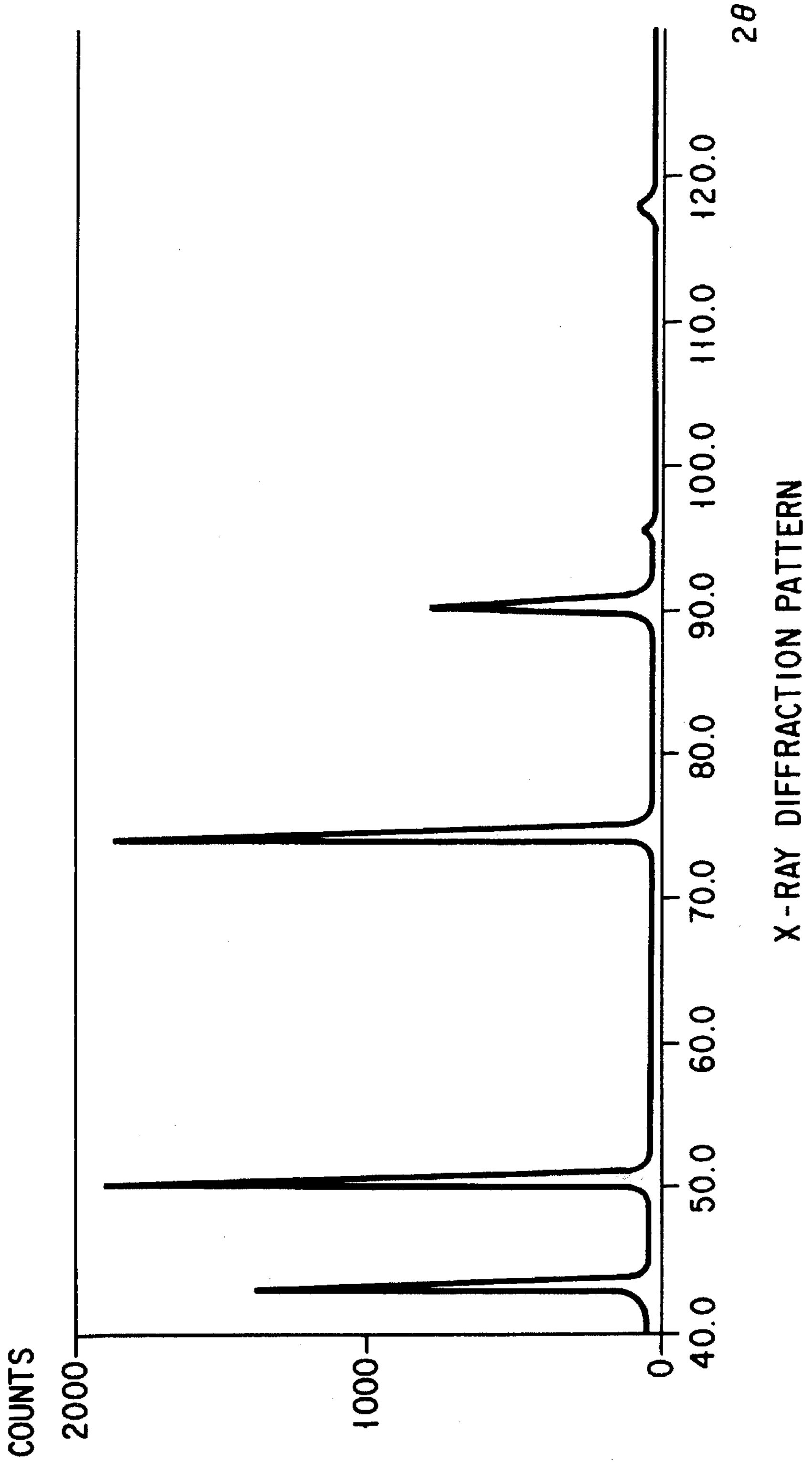
FIG. 6 is a graph showing the X-ray diffraction pattern of a shadow mask plate material obtained in Example 2 of the present invention.
Figure 7:
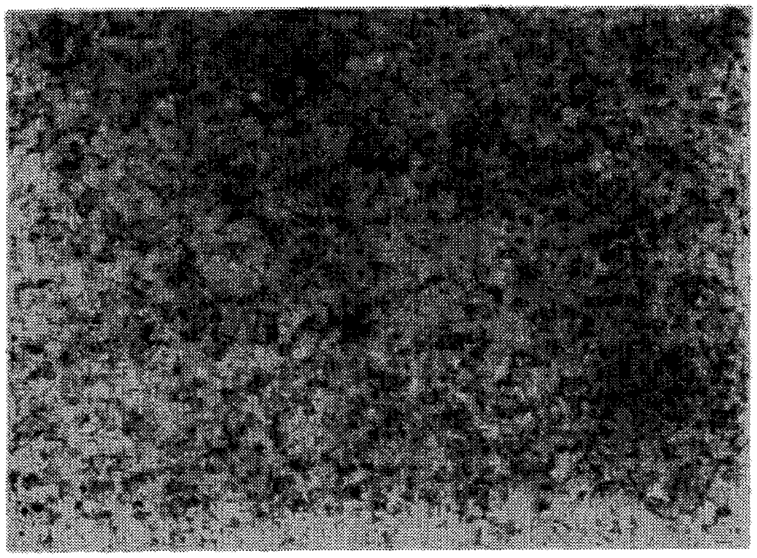
FIG. 7 is an optical micrograph showing the crystal texture of the shadow mask plate material obtained in Example 2 of the present invention.
Figure 8:
FIG. 8 is an electron micrograph showing the crystal texture of the shadow mask plate material obtained in Example 2 of the present invention.

X-ray diffraction was performed on the entire surface of the resultant shadow mask plate material of Example 2. Consequently, as shown in FIG. 6, the X-ray diffraction peaks of crystal faces {111}, {200}, {220}, and {310} appeared clearly. In addition, as shown in Table 2 below, assuming that the peak height of the crystal face {200} with the highest X-ray diffraction peak was 100, the X-ray diffraction peak ratios of the other crystal faces {111}, {220}, and {311} were 72, 98, and 42, respectively. FIG. 7 shows an optical micrograph (×500) of the shadow mask plate material of Example 2, and FIG. 8 shows an electron micrograph of the plate material. It was confirmed from FIGS. 7 and 8 that the shadow mask plate material of Example 2 had an unrecrystallized texture consisting of fine crystal grains of 10 μm or less, and its transition density also was high.

Comparative Example 2

An ingot similar to that of Example 2 was heated at 1,300° C. for four hours and forged into a 3 mm thick plate material. Subsequently, this plate material was annealed at 1,100° C. for four hours and cold-rolled into a 0.7 mm thick plate material. The resultant plate material was subjected to intermediate annealing at 1,000° C. for 10 minutes and cold-rolled into a 0.25 mm thick plate material. Subsequently, the plate material was annealed at 800° C. for 10 minutes and flattened by skin pass, thereby manufacturing a shadow mask plate material.

Figure 9:
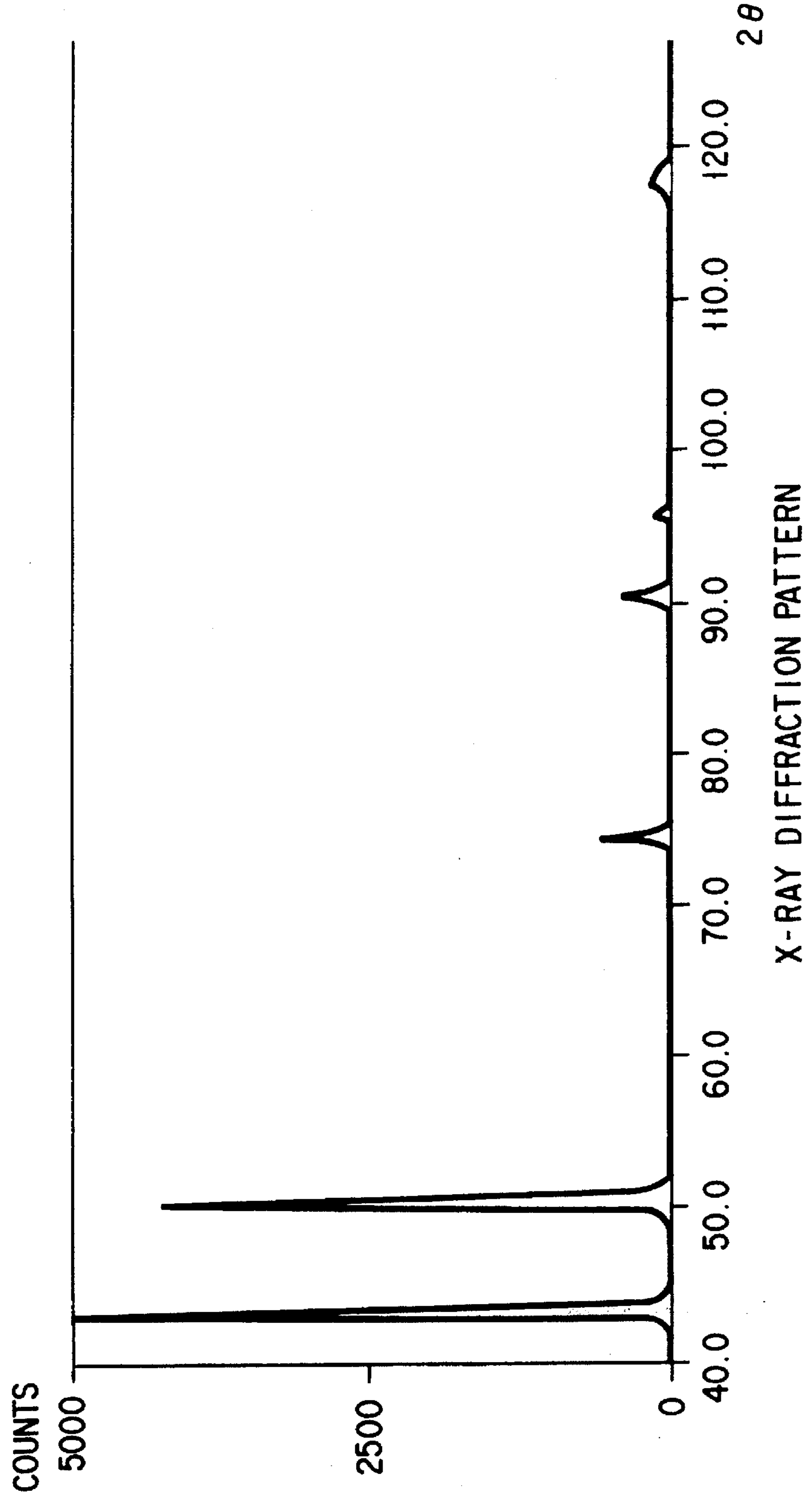
FIG. 9 is a graph showing the X-ray diffraction pattern of a shadow mask plate material obtained in Comparative Example 2.
Figure 10:
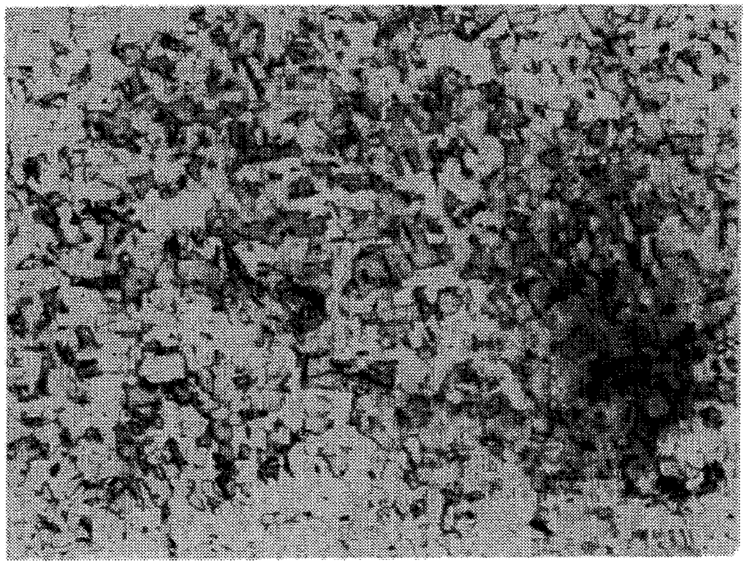
FIG. 10 is an optical micrograph showing the crystal texture of the shadow mask plate material obtained in Comparative Example 2.
Figure 11:
FIG. 11 is an electron micrograph showing the crystal texture of the shadow mask plate material obtained in Comparative Example 2.

X-ray diffraction was performed on the entire surface of the resultant shadow mask plate material of Comparative Example 2. Consequently, as shown in FIG. 9, the X-ray diffraction peaks of crystal faces {111} and {200} appeared clearly, but those of crystal faces {220} and {311} exhibited low values. In addition, as shown in Table 2 below, assuming that the peak height of the crystal face {111} with the highest X-ray diffraction peak was 100, the X-ray diffraction peak ratios of the other crystal faces {200}, {220}, and {311} were 84, 12, and 9, respectively. FIG. 10 shows an optical micrograph (×500) of the shadow mask plate material of Comparative Example 2, and FIG. 11 shows an electron micrograph of the plate material. It was confirmed from FIGS. 10 and 11 that the shadow mask plate material of Comparative Example 2 had a complete recrystallized texture consisting of large crystal grains, and its transition density also was low.

Comparative Examples 3–6

Four types of shadow mask plate materials were manufactured following the same procedures as in Comparative Example 2 except that the working rate of cold rolling during the manufacture and the final annealing temperature were changed as shown in Table 2 below.

X-ray diffraction was performed on the entire surface of each of the resultant shadow mask plate materials of Comparative Examples 3 to 6. Consequently, the X-ray diffraction peak ratios of crystal faces {111}, {200}, {220}, and {311} were as shown in Table 2 (in which it is assumed that the highest X-ray diffraction peak of these crystal faces was 100). In addition, as in Comparative Example 2, any of the plate materials of Comparative Examples 3 to 6 had a complete recrystallized texture consisting of large crystal grains, and its transition density also was low.

Rectangular electron beam apertures with a design size of 1.7×0.7 mm were formed by a conventional photoetching process in each of the shadow mask plate materials of Example 2 and Comparative Examples 2 to 6, thereby checking the etching characteristics. The etching characteristics were evaluated as "excellent" if the aperture size accuracy of the electron beam apertures was within 2%, evaluated as "good" if the aperture size accuracy was within 5%, and evaluated "none" if the aperture accuracy was 7% or more. The result is shown in Table 2 below. Note that in the above etching process, in the plate material of Example 2, electron beam apertures uniform in both size and shape were formed across the entire surface and no roughness was found on the etched surface. In contrast, in any of the plate materials of Comparative Examples 2 to 6, the etching accuracy was lower than that of the plate material of Example 2, and roughness on the etched surface also was found.

The state of occurrence of white unevenness was checked by press-molding each of the plate materials of Example 2 and Comparative Examples 2 to 6 with the electron beam apertures formed, and forming a black film on it. The white unevenness was evaluated by visual check. The result is also given in Table 2. Note that Table 2 also shows the crystal textures of the shadow mask plate materials of Example 2 and Comparative Examples 2 to 6.

EXAMPLE 4

A shadow mask plate material was manufactured following the same procedures as in Example 2 except that an ingot made from an alloy consisting of 36 wt % of Ni, 0.2 wt % of Co, 0.02 wt % of Cr, 0.1 wt % or less of unavoidable impurities, such as P, Si, and Mn, and Fe as the balance was used, and the final annealing was performed at 600° C.

EXAMPLE 5

A shadow mask plate material was manufactured following the same procedures as in Example 2 except that an ingot made from an alloy consisting of 32 wt % of Ni, 5 wt % of Co, 0.2 wt % of Cr, 0.1 wt % or less of unavoidable impurities, such as P, Si, and Mn, and Fe as the balance was used, and the final annealing was performed at 620° C.

TABLE 2

| | Working rate (%) of cold working | Temperature (°C.) of final annealing | X-ray peak ratio of crystal face [111] | [200] | [220] | [311] | Crystal texture | Etching characteristics | Occurrence of white unevenness |
|---|---|---|---|---|---|---|---|---|---|
| Example 2 | 64 | 620 | 72 | 100 | 98 | 42 | Unrecrystallization | Excellent | None |
| Comparative Example 2 | 64 | 800 | 100 | 84 | 12 | 9 | Recrystallization | Unsatisfactory | Little |
| Comparative Example 3 | 90 | 720 | 10 | 100 | 3 | 2 | Recrystallization | Unsatisfactory | Little |
| Comparative Example 4 | 85 | 750 | 24 | 100 | 3 | 3 | Recrystallization | Unsatisfactory | Little |
| Comparative Example 5 | 40 | 800 | 100 | 93 | 28 | 15 | Recrystallization | Good | Little |
| Comparative Example 6 | 30 | 800 | 100 | 85 | 25 | 21 | Recrystallization | Good | Very Little |

As is apparent from Table 2, the shadow mask plate material of Example 2, in which the X-ray diffraction peak ratios of crystal faces {111}, {200}, {220}, and {311} on the surface were 20 or more assuming that the highest X-ray diffraction peak of these crystal faces was 100, and which had an unrecrystallized texture, had excellent etching characteristics for forming electron beam apertures. It was also found that a high-quality shadow mask free from white unevenness could be formed from this plate material.

In contrast, any of the shadow mask plate materials of Comparative Examples 2 to 5, in which one of the X-ray diffraction peak ratios of crystal faces {200}, {220}, and {311} on the surface was less than 20 assuming that the highest X-ray diffraction peak of these crystal faces was 100, and which had a recrystallized texture, had unsatisfactory etching characteristics for forming electron beam apertures, and a shadow mask formed from this plate material caused white unevenness. Especially, the etching characteristics of the shadow mask plate materials of Comparative Examples 2 to 5 were remarkably degraded. In addition, although the shadow mask plate material of Comparative Example 6, in which the X-ray diffraction peak ratios of crystal faces {111}, {200}, {220}, and {311} on the surface were 20 or more assuming that the highest x-ray diffraction peak of these crystal faces was 100, and which had a recrystallized texture, had good etching characteristics for forming electron beam apertures, a shadow mask formed from this plate material caused white unevenness.

EXAMPLE 3

A shadow mask plate material was manufactured following the same procedures as in Example 2 except that an ingot made from an alloy consisting of 32 wt % of Ni, 5 wt % of Co, 0.1 wt % or less of unavoidable impurities, such as P, Si, and Mn, and Fe as the balance was used, and the final annealing was performed at 640° C.

X-ray diffraction was performed on the entire surface of each of the resultant shadow mask plate materials of Examples 3 to 5. Consequently, the X-ray diffraction peak ratios of crystal faces {111}, {200}, {200}, and {311} were as shown in Table 3 (in which it is assumed that the highest X-ray diffraction peak of these crystal faces was 100). In addition, it was found from observation using electron and optical micrographs that any of the plate materials of Examples 3 to 5 had an unrecrystallized texture consisting of fine crystal grains of 10 μm or less, and its transition density was also high.

Rectangular electron beam apertures with a design size of 1.7×0.7 mm were formed by a conventional photoetching process in each of the shadow mask plate materials of Examples 3 to 5, thereby checking the etching characteristics following the same evaluation as in Example 2. The result is shown in Table 3 below. Note that in the above etching process, in any of the plate materials of Examples 3 to 5, electron beam apertures uniform in both size and shape were formed across the entire surface and no roughness was found on the etched surface.

The state of occurrence of white unevenness was checked by press-molding each of the plate materials of Examples 3 to 5 with the electron beam apertures formed, and forming a black film on it. The white unevenness was evaluated by visual check. The result is also given in Table 3. Note that Table 3 also shows the crystal textures of the shadow mask plate materials of Examples 3 to 5.

TABLE 3

| | X-ray peak ratio of crystal face | | | | | Etching | Occurrence of white |
|---|---|---|---|---|---|---|---|
| | [111] | [200] | [220] | [311] | Crystal texture | characteristics | unevenness |
| Example 3 | 100 | 60 | 30 | 40 | Unrecrystallization | Excellent | None |
| Example 4 | 50 | 92 | 100 | 20 | Unrecrystallization | Excellent | None |
| Example 5 | 90 | 100 | 73 | 50 | Unrecrystallization | Excellent | None |

As is apparent from Table 3, the shadow mask plate material of Examples 3 to 5, in which the X-ray diffraction peak rations of crystal face {111}, {200}, {220}, and {311} on the surface were 20 or more assuming that the highest X-ray diffraction peak of these crystal faces was 100, and which has a unrecrystallized texture, has excellent etching characteristics for forming electron beam apertures. It was also found that high-quality shadow masks free from white unevenness could be formed from those plate materials.

In addition, each of shadow mask which consists of the plate materials containing chromium was formed a stable black film on its surface, and had excellent heat dissipation properties.

EXAMPLE 6

An invar alloy consisting of 36.2 wt % of Ni, 0.0002 wt % of B, 0.1 wt % or less of unavoidable impurities, such as P, Si, and Mn, and Fe as the balance was melted to form an ingot weighing five tons. The ingot was then heated at 1,150° C. for four hours and formed into a 4 mm thick plate material by hot working. Subsequently, this plate material was annealed at 1,100° C. for four hours and cold-rolled into a 0.7 mm thick plate material. The resultant plate material was subjected to intermediate annealing at 800° C. and cold-rolled into a 0.3 mm thick plate material. Subsequently, the plate material was annealed at 850° C. for one minute and cold-rolled into a 0.2 mm thick plate material. Thereafter, the plate material was subjected to softening annealing in an oven set at 800° C., which was below the recrystallization temperature, for a detention time of 10 seconds and flattened by skin pass, thereby manufacturing a shadow mask plate material. Note that the maximum temperature of the plate material in the softening annealing step is estimated to be approximately 700° C. although it could not be actually measured.

By observation using electron and optical micrographs, the shadow mask plate material of Example 6 was found to have an unrecrystallized texture consisting of fine crystal grains of 10 μm or less.

EXAMPLE 7

A shadow mask plate material was manufactured following the same procedures as in Example 6 except that an ingot made from an invar alloy consisting of 36.2 wt % of Ni, 0.003 wt % of B, 0.1 wt % or less of unavoidable impurities, such as P, Si, and Mn, and Fe as the balance was used. By observation using electron and optical micrographs, this shadow mask plate material was found to have an unrecrystallized texture consisting of fine crystal grains of 10 μm or less.

EXAMPLE 8

A shadow mask plate material was manufactured following the same procedures as in Example 6 except that an ingot made from an invar alloy consisting of 36.2 wt % of Ni, 0.005 wt % of B, 0.1 wt % or less of unavoidable impurities, such as P, Si, and Mn, and Fe as the balance was used. By observation using electron and optical micrographs, this shadow mask plate material was found to have an unrecrystallized texture consisting of fine crystal grains of 10 μm or less.

EXAMPLE 9

A shadow mask plate material was manufactured following the same procedures as in Example 6 except that an ingot made from an invar alloy consisting of 33.7 wt % of Ni, 0.008 wt % of B, 1.5 wt % of Co, 1.0 wt % of Cr, 0.1 wt % or less of unavoidable impurities, such as P, Si, and Mn, and Fe as the balance was used. By observation using electron and optical micrographs, this shadow mask plate material was found to have an unrecrystallized texture consisting of fine crystal grains of 10 μm or less.

Comparative Example 7

A shadow mask plate material was manufactured following the same procedures as in Example 6 except that an ingot made from an invar alloy consisting of 36.2 wt % of Ni, 0.005 wt % of B, 0.1 wt % or less of unavoidable impurities, such as P, Si, and Mn, and Fe as the balance was used, and low-temperature annealing was performed at 900° C. for 30 seconds. By observation using electron and optical micrographs, this shadow mask plate material was found to have a complete recrystallized texture consisting of large crystal grains.

Rectangular electron beam apertures with a design size of 1.7×0.7 mm were formed by a conventional photoetching process in each of the shadow mask plate materials of Examples 6 to 9 and Comparative Example 7, and press molding and formation of a black film were performed. Each resultant shadow mask was then subjected to checks of the etching characteristics in the formation of the electron beam apertures, the press characteristics, and the fraction defective of depression and deflection on the mask surface after the formation of the black film. The results are summarized in Table 4 below. Note that the etching characteristics were performed following the same evaluation as in Example 2. The fraction defective was evaluated by the number of defective plate materials per 100 plate materials. Table 4 also shows the crystal textures of the shadow mask plate materials of Examples 6 to 9 and Comparative Example 7.

TABLE 4

| | Content (wt %) of B | Crystal texture | Etching characteristics | Press molding characteristics | Fraction defective Depression*1 | Fraction defective Deflection*2 |
|---|---|---|---|---|---|---|
| Example 6 | 0.0002 | Unrecrystallization | Excellent | Good | 7/100 | 8/100 |
| Example 7 | 0.003 | Unrecrystallization | Excellent | Good | 2/100 | 3/100 |
| Example 8 | 0.005 | Unrecrystallization | Excellent | Good | 0/100 | 0/100 |
| Example 9 | 0.008 | Unrecrystallization | Excellent | Good | 0/100 | 0/100 |
| Comparative Example 7 | 0.005 | Recrystallization | Unsatisfactory | Good | 6/100 | 2/100 |

*1Depression defective: a mask which could not be molded into a predetermined R shape and partially deformed 1 mm or more after being pressed was evaluated to be defective.
*2Deflection defective: a mask which deflected 3 mm or more in a central portion of an R shape when oscillated (20 cm) at a rate of 5 m/sec in a direction perpendicular to the mask was evaluated to be defective.

As can be seen from Table 4, any of the shadow mask plate materials of Examples 6 to 9, which contained a predetermined amount (0.0001 to 0.01 wt %) of B and had an unrecrystallized texture, caused few defectives derived from depression and deflection on the mask surface after formation of the black film and had excellent etching characteristics, and it was possible to manufacture a shadow mask having uniform electron beam apertures from the plate material. On the other hand, the shadow mask plate material of Comparative Example 7, which was made from an invar alloy containing 0.005 wt % of B but had a complete recrystallized texture, had a high fraction defective caused by depression and deflection on the mask surface after formation of the black film.

EXAMPLE 10

An invar alloy consisting of 36.2 wt % of Ni, 0.005 wt % of B, 0.1 wt % or less of unavoidable impurities, such as P, Si, and Mn, and Fe as the balance was melted to form an ingot 600 mm wide, 10 m long, and 150 mm thick and weighing five tons. The ingot was then heated at 1,200° C. for four hours and formed into a 3 mm thick plate material by hot working. Subsequently, this plate material was annealed at 1,100° C. for four hours and cold-rolled into a 0.7 mm thick plate material. The resultant plate material was subjected to intermediate annealing at 900° C. and cold-rolled into a 0.25 mm thick plate material. Subsequently, the plate material was continuously annealed at 620° C. and flattened by skin pass, thereby manufacturing a shadow mask plate material. Note that in the manufacture of this plate material, the working rate in the cold rolling step was 50% or more.

EXAMPLE 11

A shadow mask plate material was manufactured following the same procedures as in Example 10 except that an ingot made from an invar alloy consisting of 36.2 wt % of Ni, 0.008 wt % of B, 0.1 wt % or less of unavoidable impurities, such as P, Si, and Mn, and Fe as the balance was used.

Comparative Example 8

A shadow mask plate material was manufactured following the same procedures as in Example 10 except that the working rate in the cold rolling during the manufacture was set at 90% and the final annealing temperature was set at 720° C.

Comparative Example 9

A shadow mask plate material was manufactured following the same procedures as in Example 10 except that the working rate in the cold rolling during the manufacture was set at 40% and the final annealing temperature was set at 720° C.

X-ray diffraction was performed on the entire surface of each of the resultant shadow mask plate materials of Examples 10 and 11 and Comparative Examples 8 and 9. As result, the X-ray diffraction peak ratios of crystal faces {111}, {200}, {220}, and {311} were as shown in Table 5 below (in which it is assumed that the highest X-ray diffraction peak of these crystal faces was 100). In addition, the crystal textures of the plate materials of Examples 10 and 11 and Comparative Examples 8 and 9 were observed by using electron and optical micrographs. It was consequently found that either of the plate materials of Examples 10 and 11 had an unrecrystallized texture consisting of fine crystal grains of 10 μm or less, but both the plate materials of Comparative Examples 8 and 9 had a complete recrystallized texture consisting of large crystal grains.

Rectangular electron beam apertures with a design size of 1.7×0.7 mm were formed by a conventional photoetching process in each of the shadow mask plate materials of Examples 10 and 11 and Comparative Examples 8 and 9, and press molding and formation of a blackened film were performed. Each resultant shadow mask was then subjected to checks of the etching characteristics in the formation of the electron beam apertures, the press characteristics, and the fraction defective of depression and deflection on the mask surface after the formation of the black film. The results are summarized in Table 5 below. Note that the etching characteristics were performed following the same evaluation as in Example 2. The fraction defective was evaluated by the number of defective plate materials per 100 plate materials. Table 5 also shows the crystal textures of the shadow mask plate materials of Examples 10 and 11 and Comparative Examples 8 and 9.

TABLE 5

| | Content (wt %) of B | X-ray peak ratio of crystal face [111] | [200] | [220] | [311] | Crystal texture | Etching characteristics | Press molding characteristics | Fraction defective Depression*1 | Deflection*2 |
|---|---|---|---|---|---|---|---|---|---|---|
| Example 10 | 0.005 | 70 | 100 | 90 | 41 | Unrecrystallization | Excellent | Excellent | 0/100 | 0/100 |
| Example 11 | 0.008 | 73 | 100 | 93 | 42 | Unrecrystallization | Excellent | Excellent | 0/100 | 0/100 |
| Comparative Example 8 | 0.005 | 12 | 100 | 4 | 3 | Recrystallization | Unsatisfactory | Good | 5/100 | 4/100 |
| Comparative Example 9 | 0.005 | 65 | 100 | 60 | 21 | Recrystallization | Unsatisfactory | Good | 4/100 | 3/100 |

*1Depression defective: a mask which could not be molded into a predetermined R shape and partially deformed 1 mm or more after being pressed was evaluated to be defective.
*2Deflection defective: a mask which deflected 3 mm or more in a central portion of an R shape when oscillated (20 cm) at a rate of 5 m/sec in a direction perpendicular to the mask was evaluated to be defective.

According to the present invention as has been described above, there can be provided a plate material suitable for a shadow mask of a color-CRT, which has excellent etching characteristics for forming electron beam apertures and a low thermal expansion coefficient. It is also possible to provide a plate material suitable for a shadow mask of a flat color-CRT, which has a high strength, can prevent occurrence of defects caused by depression and deflection after formation of a black film, and is superior in etching characteristics and blackening characteristics.

In addition, according to the present invention, there can be provided a shadow mask having high-accuracy, fine electron beam apertures and capable of preventing a positional difference of the electron beam apertures resulting from a temperature rise upon bombardment of electron beams. Furthermore, it is possible to provide a shadow mask suitable for a large-size, high-quality color-CRT, which has high-accuracy, fine electron beam apertures, can prevent a positional difference of the electron beam apertures resulting from a temperature rise upon bombardment of electron beams, and can discourage occurrence of depression and deflection derived from thin film formation and flattening.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A shadow mask comprising a plate material consisting of an Fe-Ni-based alloy, a plurality of fine electron beam apertures formed in said plate material, and a black film formed on the surface of said plate material, and manufactured by a method comprising the steps of:

forming a plurality of fine electron beam apertures in a plate material consisting of an Fe-Ni-based alloy which contains iron and nickel as main constituents, and having an unrecrystallized texture with a grain size of not more than 10 μm;

press-molding said plate material; and forming a black film on the surface of said plate material.

2. A shadow mask according to claim 1, wherein a nickel amount in said Fe-Ni-based alloy is 20 to 48 wt %.

3. A shadow mask according to claim 1, wherein said Fe-Ni-based alloy has a composition in which a portion of nickel is substituted with at least one metal selected from the group consisting of cobalt and chromium.

4. A shadow mask according to claim 3, wherein a substitution amount of cobalt is 0.01 to 10 wt %, and a substitution amount of chromium is 0.01 to 5 wt %.

5. A shadow mask according to claim 1, wherein X-ray diffraction peak ratios of at least crystal faces {111}, {200}, {220}, and {311} on the surface are not less than 20 assuming that the highest X-ray diffraction peak of the crystal faces is 100.

6. A shadow mask according to claim 5, wherein X-ray diffraction peak ratios of at least two crystal faces selected from the group consisting of {111}, {200}, {220}, and {311} on the surface are 70 or more.

7. A shadow mask comprising a plate material consisting of an Fe-Ni-based alloy, a plurality of fine electron beam apertures formed in said plate material, and a black film formed on the surface of said plate material, and manufactured by a method comprising the steps of:

forming a plurality of fine electron beam apertures in a plate material consisting of an Fe-Ni-based alloy which contains iron and nickel as main constituents and not more than 0.01 wt % of boron, and having an unrecrystallized texture with a grain size of not more than 10 μm;

press-molding said plate material; and forming a black film on the surface of said plate material.

8. A shadow mask according to claim 7, wherein a nickel amount in said Fe-Ni-based alloy is 20 to 48 wt %.

9. A shadow mask according to claim 7, wherein a boron amount in said Fe-Ni-based alloy is 0.0001 to 0.01 wt %.

10. A shadow mask according to claim 7, wherein a boron amount in said Fe-Ni-based alloy is 0.001 to 0.008 wt %.

11. A shadow mask according to claim 7, wherein said Fe-Ni-based alloy has a composition in which a portion of nickel is substituted with at least one metal selected from the group consisting of cobalt and chromium.

12. A shadow mask according to claim 11, wherein a substitution amount of cobalt is 0.01 to 10 wt %, and a substitution amount of chromium is 0.01 to 5 wt %.

13. A shadow mask according to claim 7, wherein X-ray diffraction peak ratios of at least crystal faces {111}, {200}, {220}, and {311} on the surface are not less than 20 assuming that the highest X-ray diffraction peak of the crystal faces is 100.

14. A shadow mask according to claim 13, wherein X-ray diffraction peak ratios of at least two crystal faces selected from the group consisting of {111}, {200}, {220}, and {311} on the surface are 70 or more.

* * * * *